(12) United States Patent
Iizuka et al.

(10) Patent No.: US 8,497,170 B2
(45) Date of Patent: Jul. 30, 2013

(54) SEMICONDUCTOR DEVICE MANUFACTURE METHOD AND SEMICONDUCTOR DEVICE

(75) Inventors: Kenzo Iizuka, Yokohama (JP); Hajime Kurata, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 117 days.

(21) Appl. No.: 13/207,931

(22) Filed: Aug. 11, 2011

(65) Prior Publication Data

US 2012/0119299 A1    May 17, 2012

(30) Foreign Application Priority Data

Nov. 17, 2010    (JP) .................................. 2010-256763

(51) Int. Cl.
*H01L 21/8238*    (2006.01)
(52) U.S. Cl.
USPC ............ 438/218; 438/258; 438/302; 257/368
(58) Field of Classification Search
USPC ........................... 438/218, 258, 302; 257/368
See application file for complete search history.

(56) References Cited

U.S. PATENT DOCUMENTS

| 6,541,823 B1 | 4/2003 | Yoshiyama et al. |
| 6,853,030 B2 | 2/2005 | Yoshiyama et al. |
| 2005/0062099 A1 | 3/2005 | Yoshiyama et al. |

FOREIGN PATENT DOCUMENTS

JP    11-067927 A    3/1999

*Primary Examiner* — Tan N Tran
(74) *Attorney, Agent, or Firm* — Fujitsu Patent Center

(57) ABSTRACT

A semiconductor device manufacturing method includes: forming a first active region and a second active region in a semiconductor substrate; forming a first gate insulating film on the first active region and a second gate insulating film thinner than the first gate insulating film on the second active region by using material containing silicon oxide; forming first and second gate electrodes on the first and second gate insulating films respectively; forming an insulating film on the semiconductor substrate, and anisotropically etching the insulating film to leave first side wall insulating films on side walls of the first and second gate electrodes; removing the first side wall insulating film on the first gate electrode; and after removing the first side wall insulating film on the first gate electrode, thermally treating in an oxidizing atmosphere the semiconductor substrate to form a second side wall insulating film on the first gate electrode.

6 Claims, 15 Drawing Sheets

AL
Low Vdd Tr.

AH
High Vdd Tr.

SEMICONDUCTOR DEVICE MANUFACTURE METHOD AND SEMICONDUCTOR DEVICE

CROSS-REFERENCE TO RELATED APPLICATION

This application is based upon and claims the benefit of priority of the prior Japanese Patent Application No. 2010-256763, filed on Nov. 17, 2010, the entire contents of which are incorporated herein by reference.

FIELD

The embodiments discussed herein are related to a semiconductor device manufacture method and a semiconductor device.

BACKGROUND

Techniques of forming e.g., logic MOS transistors using relatively low gate voltage and e.g., input/output MOS transistors using relatively high gate voltage on the same substrate have been developed (e.g., refer to JP-A-No. 11-67927). A relatively thin gate insulating film is used for MOS transistor with low gate voltage, whereas a relatively thick gate insulating film is used for MOS transistor with high gate voltage.

SUMMARY

According to an aspect of the invention, a semiconductor device manufacturing method includes: forming an element isolation insulating film in a semiconductor substrate to define a first active region and a second active region; forming a first gate insulating film containing silicon oxide having a first film thickness on the first active region and a second gate insulating film containing silicon oxide having a second film thickness thinner than the first film thickness; forming a polysilicon film above the semiconductor substrate, the first gate insulating film and the second gate insulating film; patterning the polysilicon film to form a first gate electrode on the first gate insulating film and a second gate electrode on the second gate insulating film; forming an insulating film above the semiconductor substrate, the first and second gate electrodes; anisotropically etching the insulating film to leave first side wall insulating films on side wall of the first gate electrode and on side wall of the second gate electrode; removing the first side wall insulating film on the side wall of the first gate electrode; and after removing the first side wall insulating film on the side wall of the first gate electrode, thermally treating in an oxidizing atmosphere the semiconductor substrate to form a second side wall insulating film on the side wall of the first gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Description will now be made on a semiconductor device manufacture method according to an embodiment of the present invention. FIGS. 1 to 14 are schematic cross sectional views illustrating main processes of a semiconductor device manufacture method according to an embodiment. In this embodiment, a MOS transistor having relatively thin gate insulating film and applied with relatively low gate voltage (e.g., 1.0 V) and a MOS transistor having relatively thick gate insulating film and applied with relatively high gate voltage (e.g., 1.5 V) are separately formed on the same substrate.

A MOS transistor applied with relatively low gate voltage is called a low voltage transistor, whereas a MOS transistor applied with relatively high gate voltage is called a high voltage transistor. The low voltage transistor is, e.g., a logic transistor, and the high voltage transistor is, e.g., an input/output transistor. Description will continue on forming n-type MOS transistors as an example of low voltage transistor and high voltage transistor.

Figure 1:
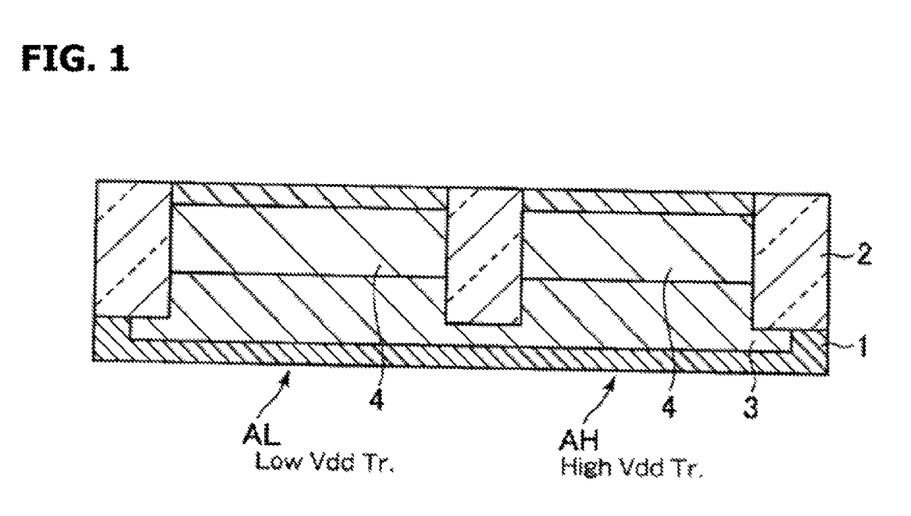
FIGS. 1 to 14 are schematic cross sectional views illustrating main processes of a semiconductor device manufacture method according to an embodiment.

Reference is made to FIG. 1. An element isolation film 2 is formed in a silicon substrate 1 by, e.g., shallow trench isolation (STI) to form an active region AL where a low voltage transistor (Low Vdd Tr.) is formed and an active region AH where a high voltage transistor (High Vdd Tr.) is formed.

A well region 3 is formed by implanting p-type impurity, e.g., B, into the substrate 1 at an acceleration energy of 100 keV and a dose of $1\times10^{13}$ cm$^{-2}$.

Channel regions 4 are formed by implanting p-type impurity into the silicon substrate 1. The impurity doping conditions for forming the channel region 4 are made different between the active region AL and active region AH. In the active region AL, e.g., B is implanted at an acceleration energy of 10 keV and a dose of $1\times10^{12}$ cm$^{-2}$. In the active region AH, e.g., B is implanted at an acceleration energy of 10 keV and a dose of $1\times10^{13}$ cm$^{-2}$. Impurity can be implanted into different active regions by using resist masks.

In forming p-type MOS transistor, for example, the following impurity doping conditions are adopted. The well region 3 is formed by implanting n-type impurity, e.g., P at acceleration energy of 300 keV and a dose of $1\times10^{13}$ cm$^{-2}$. The channel regions 4 are formed in the active region AL by implanting n-type impurity, e.g., As at an acceleration energy of 100 keV and a dose of $5\times10^{12}$ cm$^{-2}$, and in the active region AH by implanting n-type impurity, e.g., As at an acceleration energy of 100 keV and a dose of $1\times10^{13}$ cm$^{-2}$.

Figure 2:
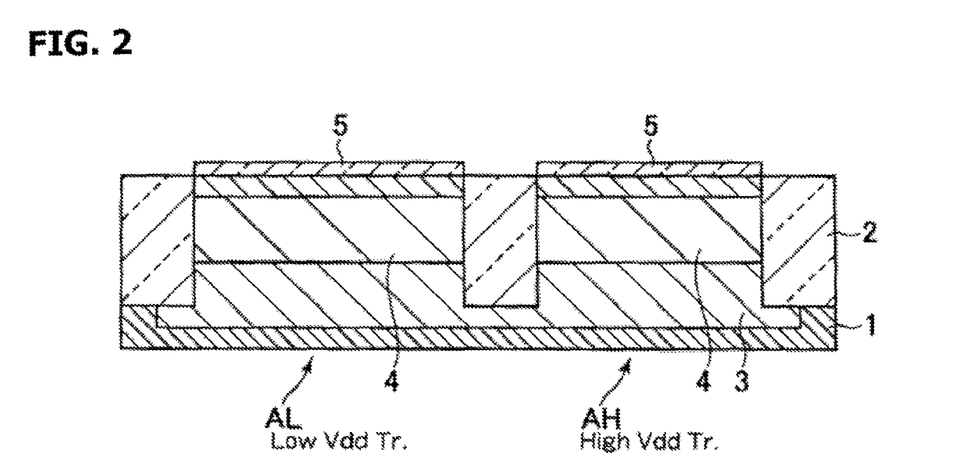

Reference is made to FIG. 2. The upper surfaces of the active region AL and active region AH are thermally oxidized to form silicon oxide films 5 having a thickness of, e.g., 3 nm (±0.3 nm).

Figure 3:
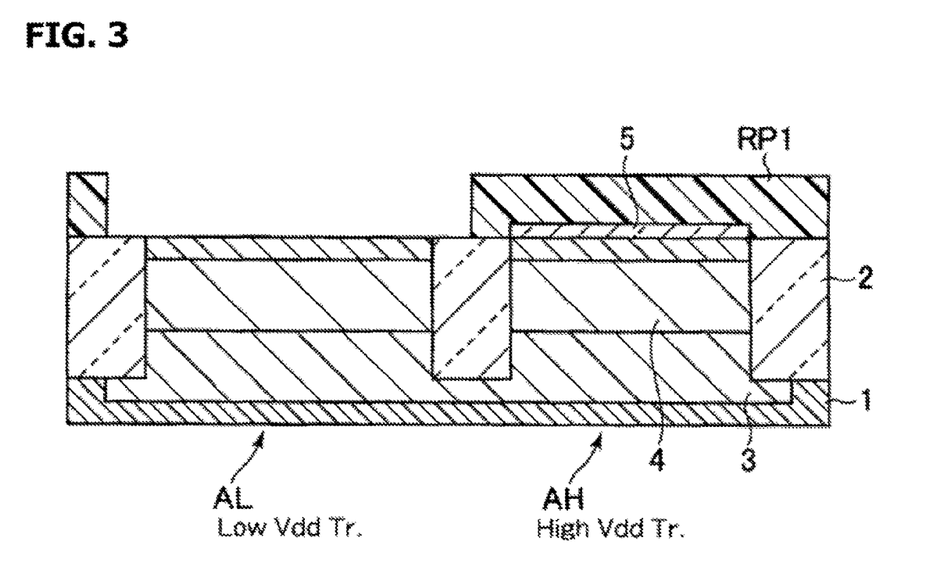

Reference is made to FIG. 3. A resist pattern RP1 is formed covering the active region AH and exposing the active region AL. By using the resist pattern as mask, the silicon oxide film 5 on the active region AL is removed by, e.g., dilute hydrofluoric acid. The silicon oxide film 5 on the active region AH is left as a gate insulting film 5 of a high voltage transistor. The resist pattern RP1 is thereafter removed.

Figure 4:
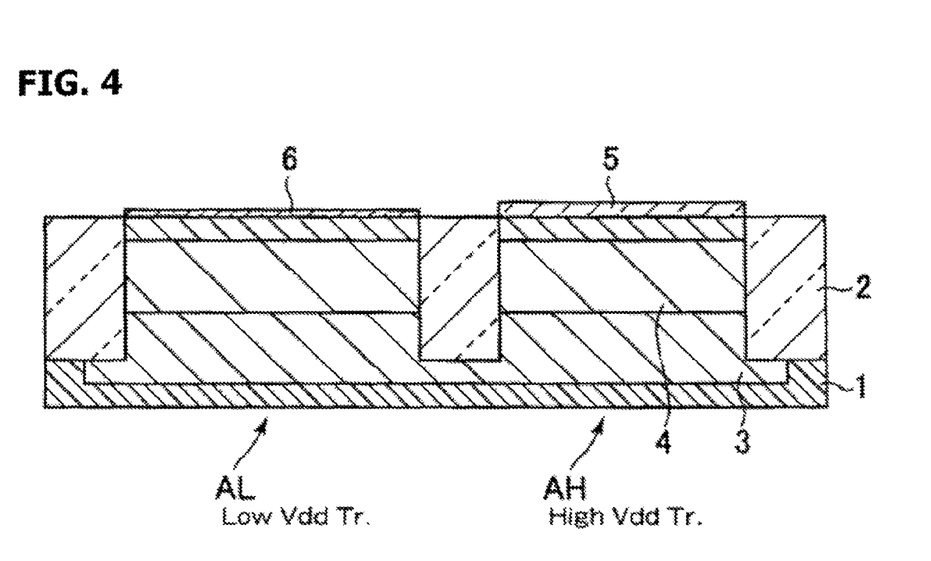

Reference is made to FIG. 4. The active region AL is thermally oxidized to grow a silicon oxide film having a thickness of, e.g., 1.3 nm (±0.1 nm) to form a gate insulating film 6 of a low voltage transistor. This thermal oxidation makes also the gate insulating film 5 of the low voltage transistor thick a little. In this manner, it becomes possible to form the thick gate insulating film 5 and thin gate insulating film 6 separately.

Figure 5:
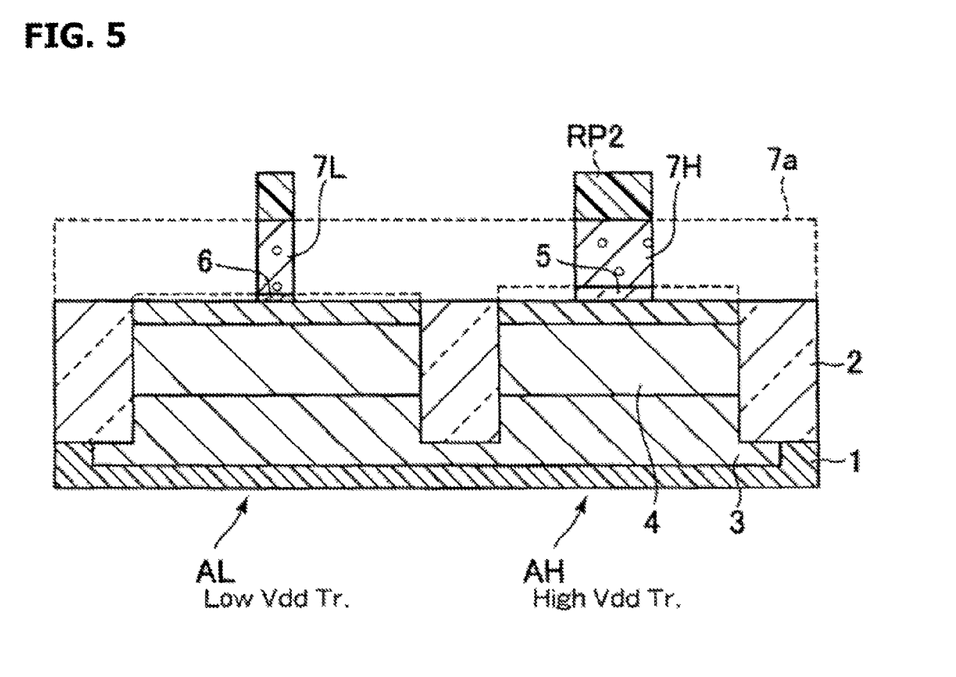

Reference is made to FIG. 5. A polysilicon film 7a is deposited on the silicon substrate 1, for example, to a thickness of about 100 nm by chemical vapor deposition (CVD), covering the gate insulating films 5 and 6. A resist pattern RP2 is formed on the polysilicon film 7a having a shape of a high voltage transistor gate electrode 7H and a low voltage gate electrode 7L.

By using the resist pattern RP2 as mask, the polysilicon film 7a is etched to leave a high voltage gate electrode 7H and a low voltage gate electrode 7L. This etching removes also the gate insulating film 5 outside the gate electrode 7H and the gate insulating film 6 outside the gate electrode 7L. The resist pattern RP2 is thereafter removed.

It is desired that the logic low voltage transistor is able to operate at high speed so that a gate length of the gate electrode 7L of the low voltage transistor is shorter than a gate length of the gate electrode 7H of the high voltage transistor.

Figure 6:
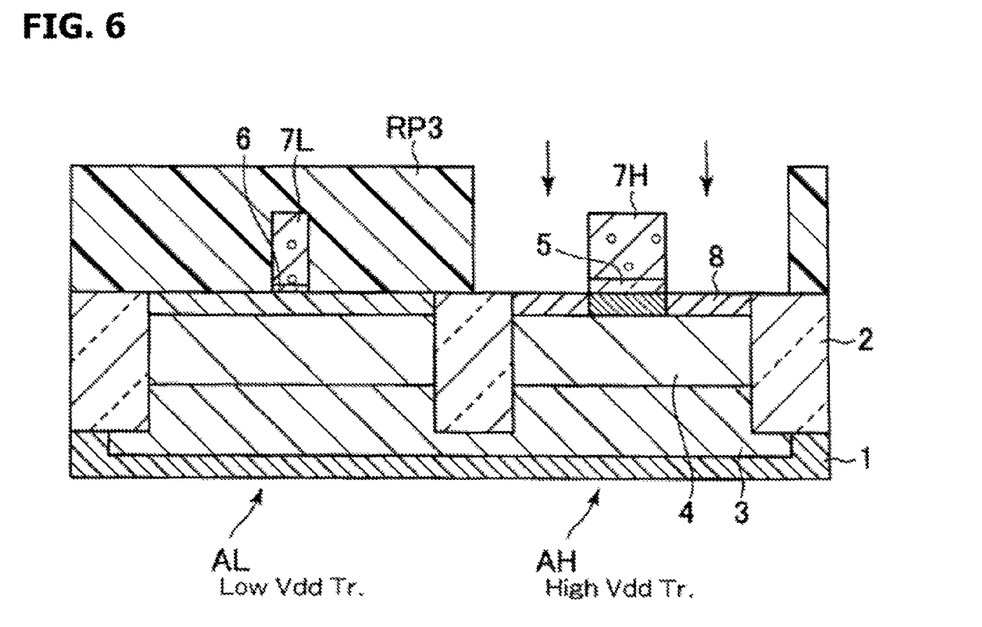

Reference is made to FIG. 6. A resist pattern RP3 is formed covering the active region AL and exposing the active region AH. By using the resist pattern RP3 and gate electrode 7H as mask, n-type impurity, e.g., As is implanted at an acceleration energy of 10 keV and a dose of $1\times10^{15}$ cm$^{-2}$ to form extension regions 8 of the high voltage transistor, and p-type impurity, e.g., B is implanted in an oblique direction at an acceleration energy of 10 keV and a dose of $1\times10^{13}$ cm$^{-2}$ to form pocket regions. The resist pattern RP3 is thereafter removed.

In forming p-type MOS transistor, for example, the following impurity doping conditions are adopted. The extension region 8 is formed by implanting p-type impurity, e.g., B at an acceleration energy of 2 keV and a dose of $1\times10^{15}$ cm$^{-2}$, and the pocket region is formed by implanting n-type impurity, e.g., As at an acceleration energy of 50 keV and a dose of $1\times10^{13}$ cm$^{-2}$.

Figure 7:
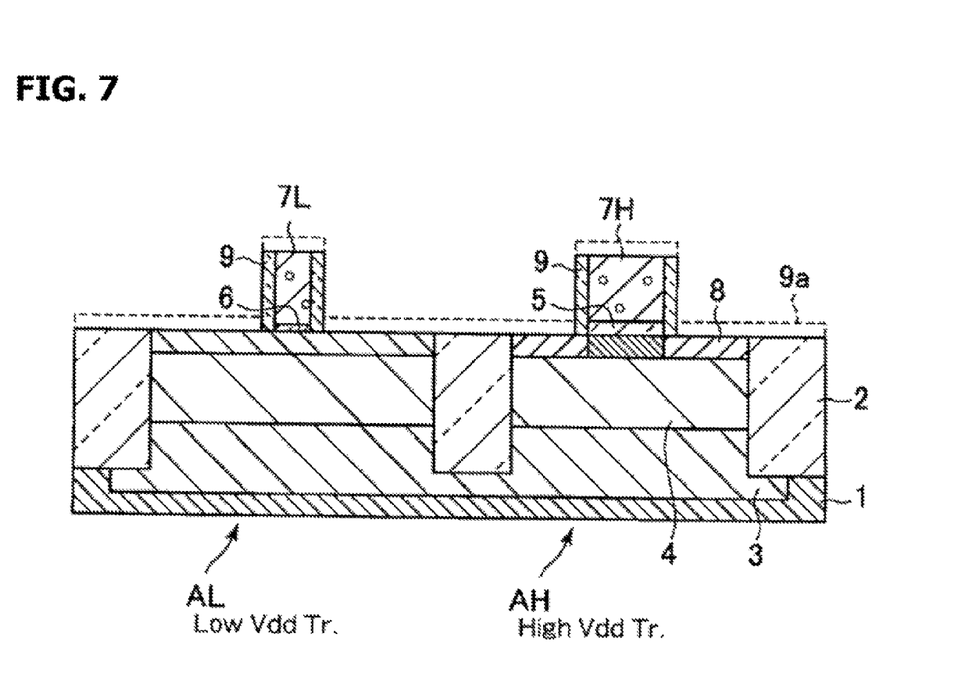

Reference is made to FIG. 7. A silicon nitride film 9a is deposited on the silicon substrate 1, for example, to a thickness of 8 nm by CVD, covering the gate electrode 7H and gate electrode 7L. The silicon nitride film 9a is anisotropically etched to leave side wall insulating films 9 on the side walls of the gate electrode 7H and gate electrode 7L.

When the gate electrode 7L of the low voltage transistor is patterned, the gate insulating film 6 outside the gate electrode 7L is removed. The lower end of the side wall insulating film 9 formed on the gate electrode 7L reaches therefore the upper surface of the silicon substrate 1 so that the side end of the gate insulating film 6 is covered with the side wall insulating film 9.

Figure 8:
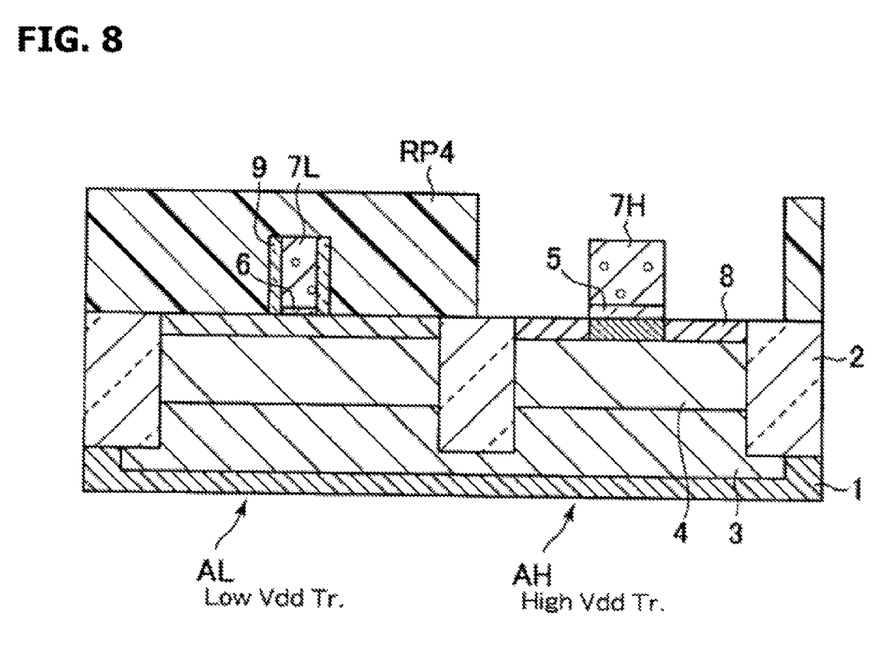

Reference is made to FIG. 8. A resist pattern RP4 is formed covering the active region AL and exposing the active region AH. By using the resist pattern RP4 as mask, the side wall insulating film 9 on the gate electrode 7H is removed by isotropic etching under the conditions of, e.g., down flow etching, micro wave 500 W (plasma), 40 Pa, CF$_4$ flow rate of 200 sccm and O$_2$ flow rate of 300 sccm. The side wall insulating film 9 of the gate electrode 7L of the low voltage transistor is left. The resist pattern RP4 is thereafter removed.

Figure 9:
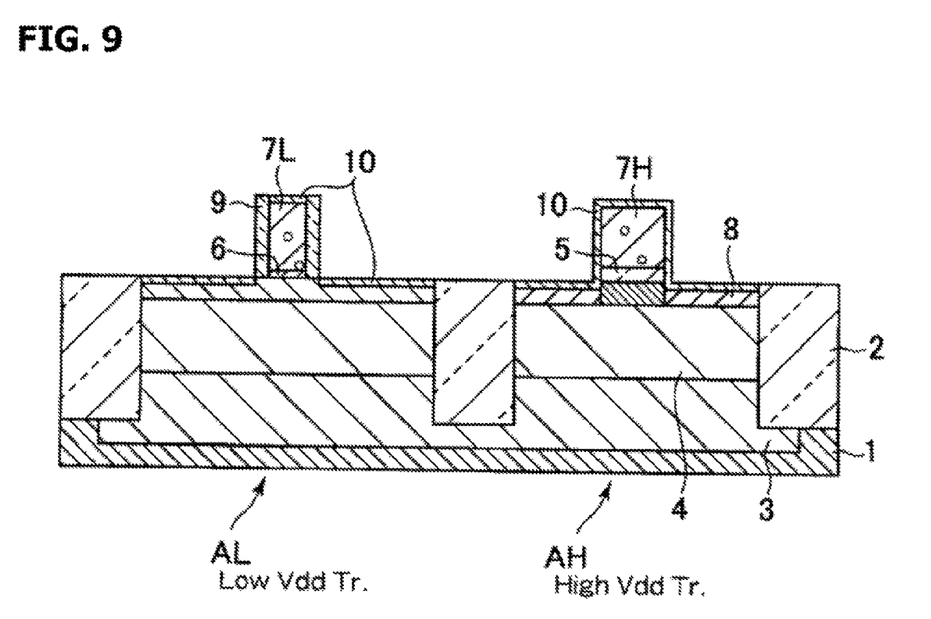

Reference is made to FIG. 9. After the side wall insulating film 9 of the gate electrode 7H is removed, the silicon substrate 1 is subjected to heat treatment in an oxidizing atmosphere. This heat treatment thermally oxidizes the side wall and upper surface of the gate electrode 7H, the exposed upper surface of the active region AH, the upper surface of the gate electrode 7L and the exposed upper surface of the active region AL to form silicon oxide films 10. The process conditions are, for example, dry oxidation in an oxygen atmosphere, a temperature of 650 to 900° C., 1 to 5 minutes, normal pressure, and a thickness of the silicon oxide film 10 of, e.g., 2 nm.

Figure 10:
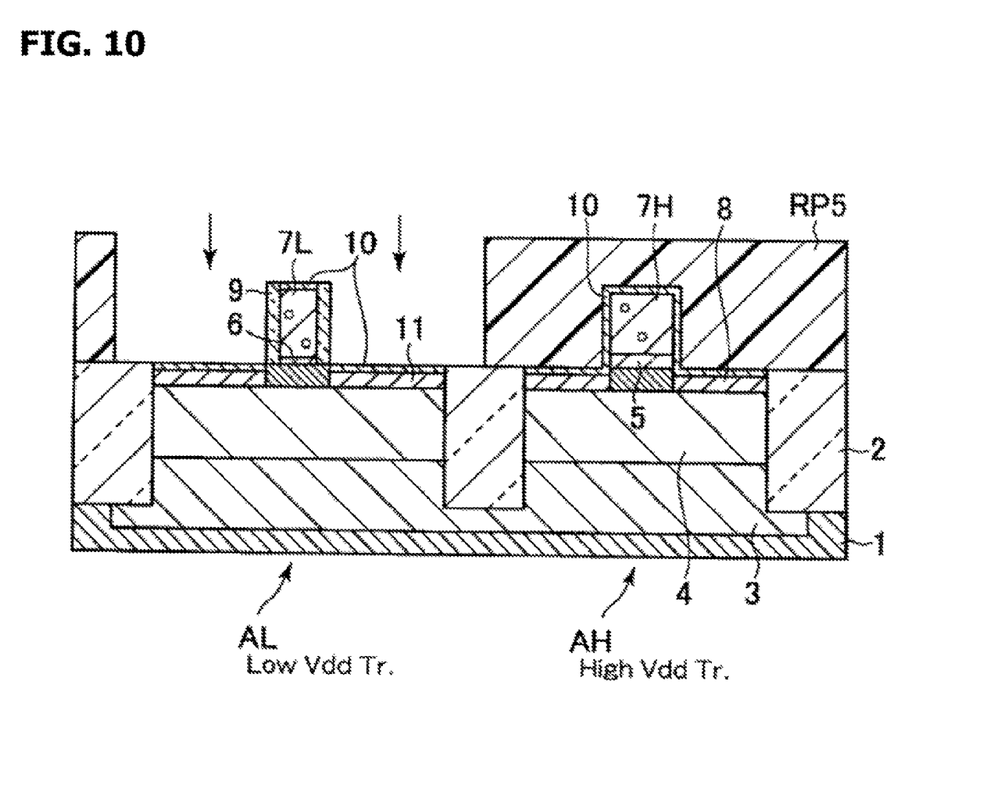

Reference is made to FIG. 10. A resist pattern RP5 is formed covering the active region AH and exposing the active region AL. By using the resist pattern RP5, gate electrode 7L, and side wall insulating film 9 as mask, the extension regions 11 of the low voltage transistor are formed by implanting n-type impurity, e.g., As at an acceleration energy of 2 keV and a dose of $1\times10^{15}$ cm$^{-2}$, and the pocket regions are formed by implanting p-type impurity, e.g., In at an acceleration energy of 50 keV and a dose of $1\times10^{13}$ cm$^{-2}$. The resist pattern RP5 is thereafter removed.

In forming p-type MOS transistor, for example, the following impurity doping conditions are adopted. The extension region 11 is formed by implanting p-type impurity, e.g., B at an acceleration energy of 0.3 keV and a dose of $1\times10^{15}$ cm$^{-2}$, and the pocket region is formed by implanting n-type impurity, e.g., Sb at an acceleration energy of 50 keV and a dose of $1\times10^{13}$ cm$^{-2}$.

Figure 11:
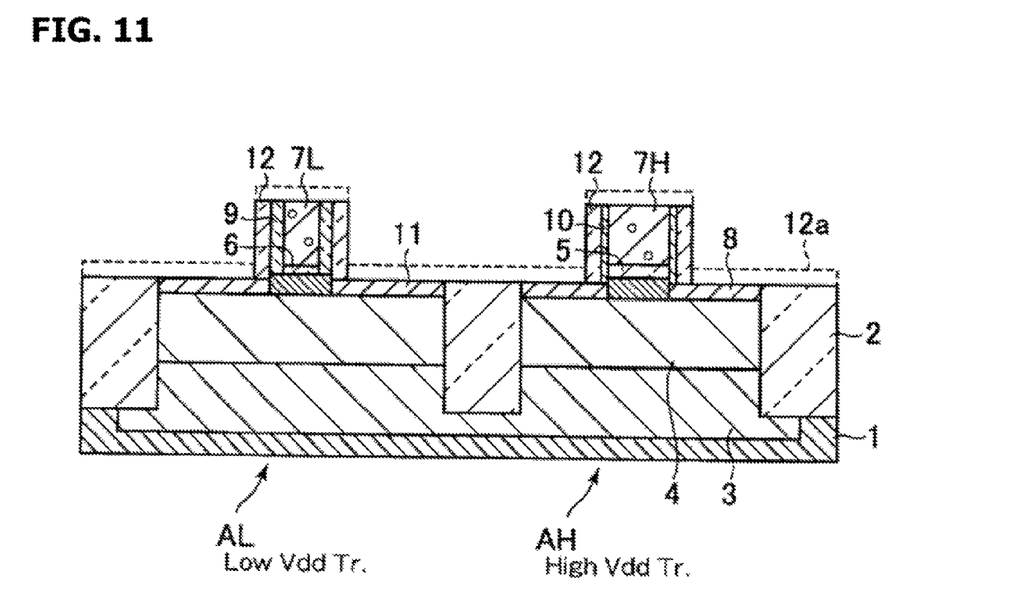

Reference is made to FIG. 11. A silicon nitride film 12a is deposited on the silicon substrate 1, for example, to a thickness of 35 nm by CVD, covering the gate electrode 7H and gate electrode 7L. The silicon nitride film 12a is anisotropically etched to leave side wall insulating films 12 on the side walls of the gate electrode 7H and gate electrode 7L.

As etching is performed for forming the side wall insulating films 12, it is considered that the silicon oxide film 10 is also removed from the upper surfaces of the gate electrode 7H, active region AH, gate electrode 7L, and active region AL.

The high voltage transistor is formed with a side wall insulating film structure in which the thermally oxidized side wall insulating film 10 is formed on the side wall of the gate electrode 7H, and the side wall insulating film 12 is stacked on the side wall insulating film 10.

The low voltage transistor is formed with a side wall insulating film structure in which the silicon nitride side wall insulating film 9 is formed on the side wall of the gate electrode 7L and the side wall insulating film 12 is stacked on the side wall insulating film 9.

Figure 12:
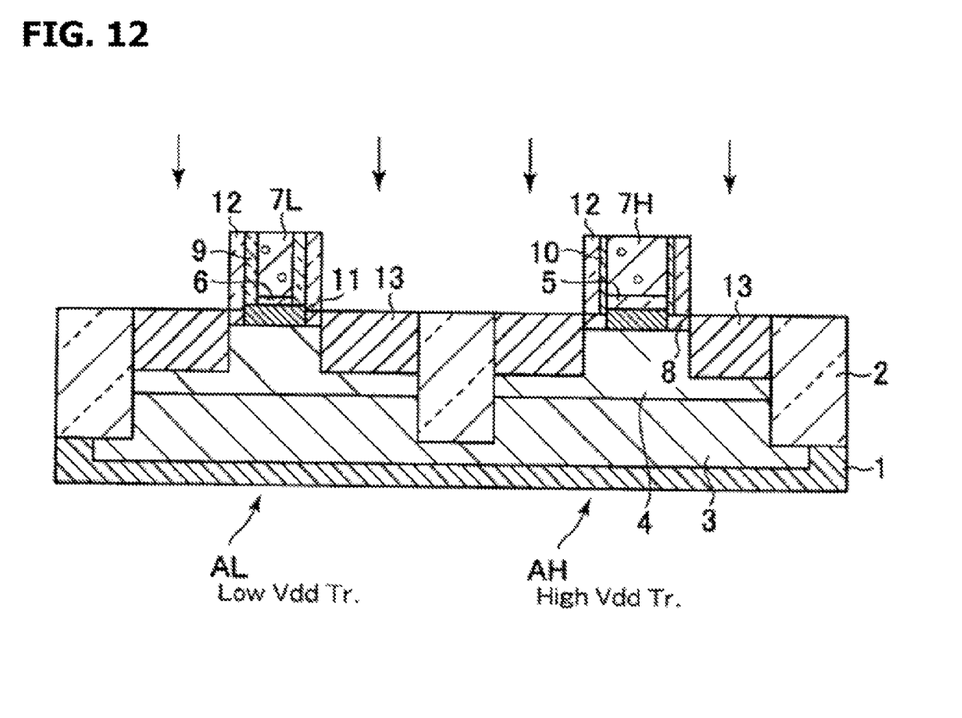

Reference is made to FIG. 12. By using as mask the side wall insulating films 10 and 12 on the side wall of the gate electrode 7H, and the side wall insulating films 9 and 12 on the side wall of the gate electrode 7L, n-type impurity, e.g., P is implanted at an acceleration energy of 5 keV and a dose of $5\times10^{15}$ cm$^{-2}$ into the active region AH and active region AL to form source/drain regions 13 of the high voltage transistor and low voltage transistor.

If p-type MOS transistor is to be formed, p-type impurity, e.g., B is implanted at an acceleration energy of 10 keV and a dose of $5\times10^{15}$ cm$^{-2}$ to form the source/drain regions 13.

Figure 13:
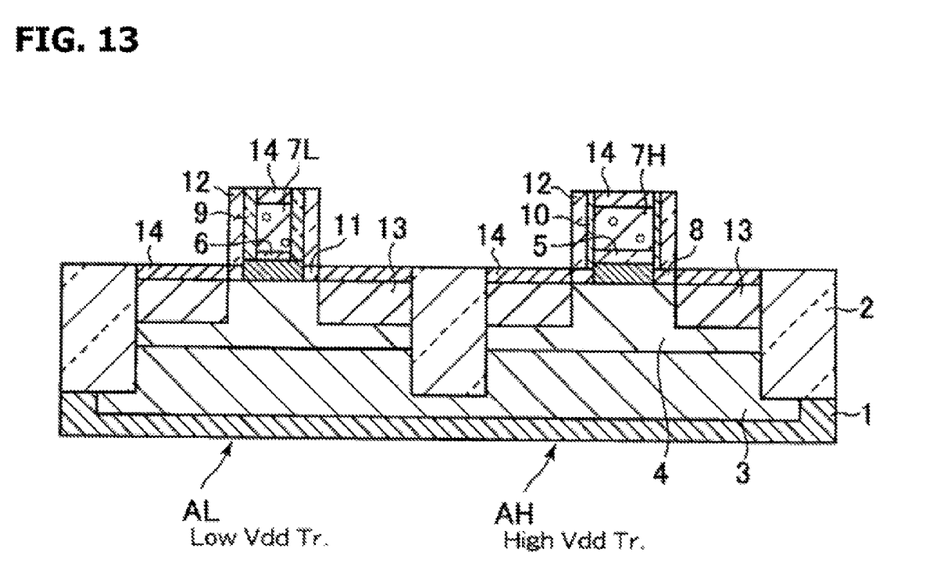

Reference is made to FIG. 13. Silicide layers 14 of, e.g., nickel silicide are formed on the upper surfaces of the active regions AH and AL and gate electrodes 7H and 7L.

Figure 14:
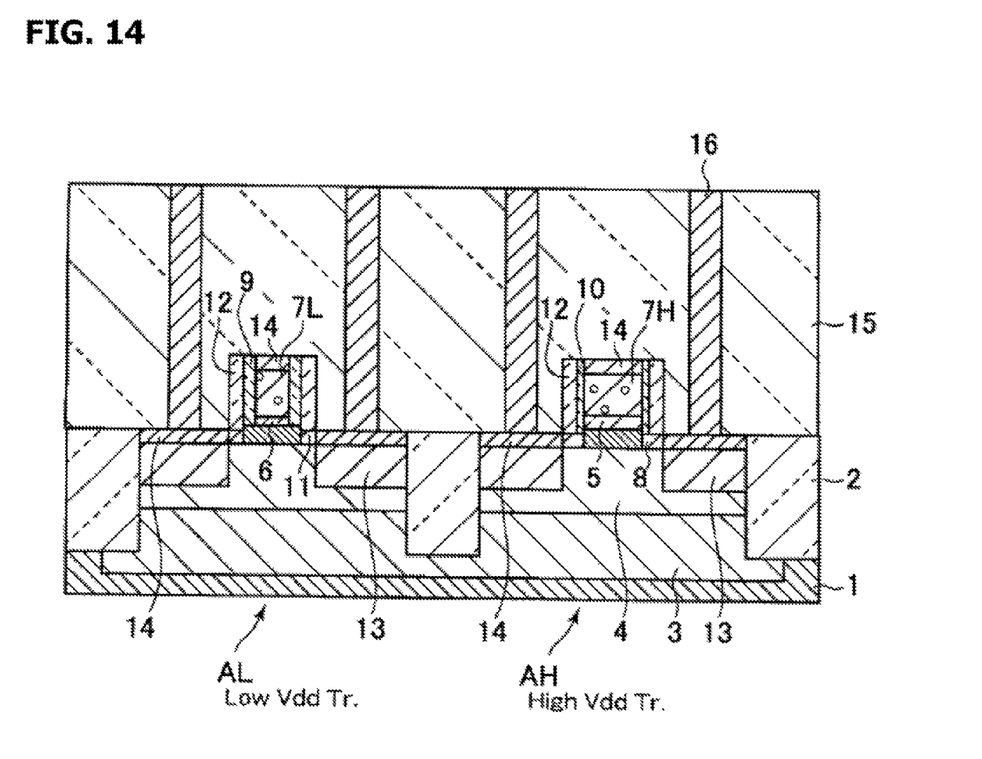

Reference is made to FIG. 14. For example, silicon oxide is deposited on the silicon substrate 1 by CVD to form an interlayer insulating film 15. Contact holes are formed through the interlayer insulating film 15 by photolithography and etching to expose the source/drain regions 13 of the low voltage transistor and high voltage transistor. Contact plugs 16 of tungsten with glue layer of titanium oxide are formed being buried in the contact holes.

A wiring structure at an upper layer is formed thereafter. In forming the upper layer wiring structure, heretofore known techniques may be used properly. In this manner, the semiconductor device of the embodiment is formed.

In the above description, impurity implantation for forming the extension region 8 of the high voltage transistor is performed before the side wall insulating films 9 are formed. This impurity implantation may be performed either before or after the side wall insulating films 9 are formed, or either before or after the oxidation process of forming the side wall insulating film 10 on the side wall of the gate electrode 7H. If this impurity implantation is to be performed in the state that the side wall insulating film 9 and side wall insulating film 10 are formed, the implantation conditions may be finely adjusted from those of the above-described embodiment.

Impurity implantation for forming the extension region 11 of the low voltage transistor is performed after the side wall insulating film 9 is formed.

In the embodiment described above, the side wall insulating film 9 with silicon nitride is formed on the gate electrode 7L of the low voltage transistor. It is preferable to use silicon nitride side wall insulating film 9 for the low voltage transistor from the viewpoint of improving the current characteristics.

As described with reference to FIG. 8, the side wall insulating film 9 of the high voltage transistor is removed.

The present inventors have found that accidental defects of insulation of the gate insulating film are likely to occur in the high voltage transistor formed by the manufacture method of a comparative example of using the silicon nitride side wall insulating film 9 for the high voltage transistor simultaneously-formed with the side wall insulating film 9 of the low voltage transistor.

In the manufacture processes of the embodiment, after the side wall insulating film 9 on the high voltage transistor side is removed, heat treatment in an oxidizing atmosphere is performed as described with reference to FIG. 9. With this process, it is possible to suppress accidental defects of the high voltage transistor gate insulating film 5. This may be because as the side wall of the gate electrode 7H is thermally oxidized, the silicon oxide film at the end of the gate insulating film 5 of the high voltage transistor becomes thick, forming a so-called bird's beak so that dielectric breakdown is difficult to occur.

In the low voltage transistor, the side wall insulating film 9 covers the side wall of the gate electrode 7L to suppress oxidation of the gate insulating film 6 near at the end portion thereof. The influence of the thermal treatment for the side wall of the gate electrode 7H upon the low voltage transistor is therefore suppressed.

The structure that the lower end of the side wall insulating film 9 reaches the upper surface of the silicon substrate 1 and the side end of the gate insulating film 6 is covered with the side wall insulating film 9 is preferable from the viewpoint of suppressing thermal oxidation of the gate insulating film 6 near at the end portions thereof.

From the viewpoint of suppressing oxidation of the gate insulating film of the low voltage transistor near at the end portions thereof, the material of the low voltage transistor side wall insulating film 9 is not limited to silicon nitride (SiN), but other insulating oxidation resistant material may also be used. In addition to SiN, the insulating oxidation resistant material usable for the side wall insulating film 9 of the low voltage transistor may be, e.g., SiO, SiOC, SiCN, SiOCN, SiON or the like.

Figure 15:
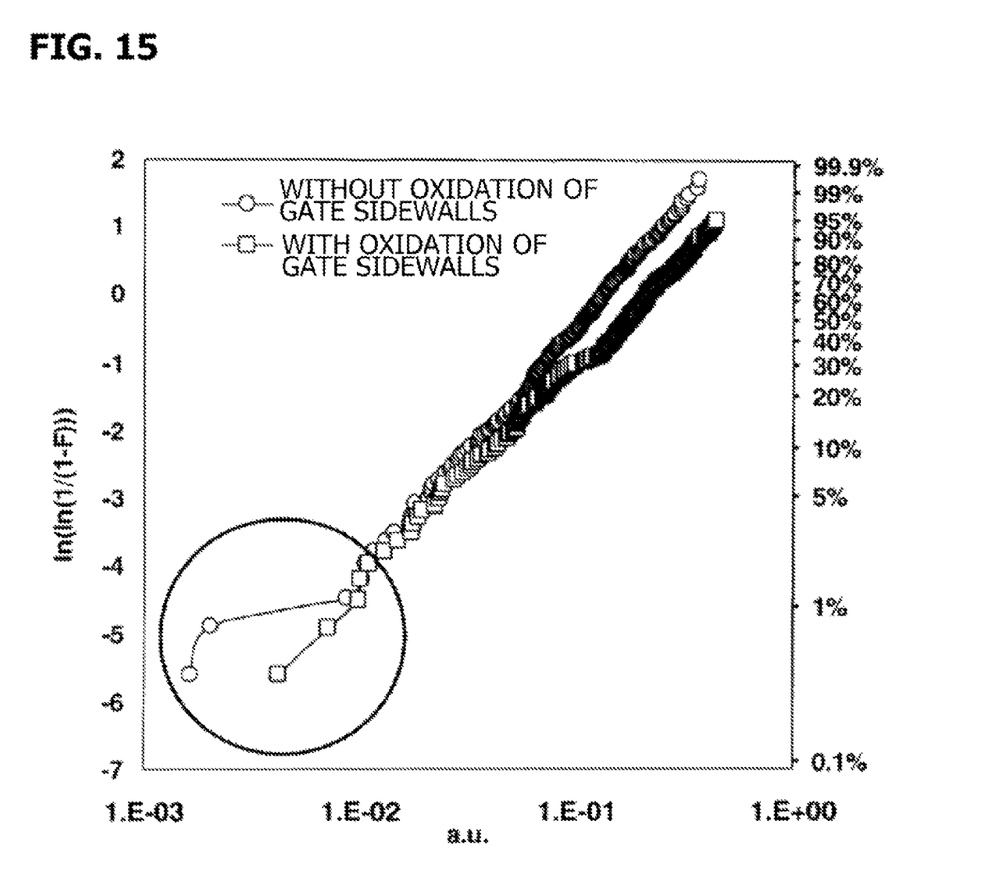
FIG. 15 is a graph illustrating the results of experiments of checking times when dielectric breakdown of gate insulating film occurs.

FIG. 15 is a graph illustrating the experiment results obtained by checking the times until dielectric breakdown of gate insulating films occur. The abscissa represents the time in an arbitrary unit, and the ordinate represents a cumulative probability. Plots represented by squares are plots for samples with oxidation process for the gate electrode side wall, and plots represented by circles are plots for samples without oxidation process for the gate electrode side wall.

As illustrated in a circle enclosure in the graph, the samples with the oxidation have the time until defects occur longer than the samples without the oxidation. By performing oxidation of gate electrode side wall, it becomes possible to suppress accidental defects of gate insulating film and improve reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:
    forming an element isolation insulating film in a semiconductor substrate to define a first active region and a second active region;
    forming a first gate insulating film containing silicon oxide having a first film thickness on the first active region and a second gate insulating film containing silicon oxide having a second film thickness thinner than the first film thickness;
    forming a polysilicon film above the semiconductor substrate, the first gate insulating film and the second gate insulating film;
    patterning the polysilicon film to form a first gate electrode on the first gate insulating film and a second gate electrode on the second gate insulating film;
    forming an insulating film above the semiconductor substrate, the first and second gate electrodes;
    anisotropically etching the insulating film to leave first side wall insulating films on side wall of the first gate electrode and on side wall of the second gate electrode;
    removing the first side wall insulating film on the side wall of the first gate electrode; and
    after removing the first side wall insulating film on the side wall of the first gate electrode, thermally treating in an oxidizing atmosphere the semiconductor substrate to form a second side wall insulating film on the side wall of the first gate electrode.

2. The semiconductor device manufacturing method according to claim 1, wherein:
    the patterning the polysilicon film to form the second gate electrode on the second gate insulating film removes the second gate insulating film outside the second gate electrode; and
    the forming the first side wall insulating film on the side wall of the second gate electrode forms the first side wall insulating film to cover the side end of the second gate insulating film.

3. The semiconductor device manufacturing method according to claim 1, wherein the first side wall insulating film is made of silicon nitride.

4. The semiconductor device manufacturing method according to claim 1, wherein the semiconductor substrate is a silicon substrate, and the forming the first gate insulating film and the second gate insulating film thermally oxidizes the first active region and the second active region to form a silicon oxide film, removes the silicon oxide film in the second active region, leaves the silicon oxide film in the first active region to form the first gate insulating film, and thermally oxidizes the second active region to form the second gate insulating film.

5. The semiconductor device manufacturing method according to claim 1, further comprising:

implanting impurity of a first conductivity type into the first active region and the second active region to form a well region;

implanting impurity of a second conductivity type opposite to the first conductivity type into the first active region by using the first gate electrode as mask; and implanting impurity of the second conductivity type into the second active region by using as mask the second gate electrode and the first side wall insulating film formed on the side wall of the second gate electrode.

6. The semiconductor device manufacturing method according to claim 1, further comprising:

after the heat treatment, forming an insulating film on the semiconductor substrate, covering the first and second gate electrodes, anisotropically etching the insulating film to leave third side wall insulating films on the second side wall insulating film on the first gate electrode and on the first side wall insulating film on the second gate electrode;

using as mask the first gate electrode, the second and third side wall insulating films formed on the first gate electrode, the second gate electrode, and the first and third side wall insulating films formed on the second gate electrode, implanting impurity of the second conductivity type into the first and second active regions.

* * * * *